United States Patent
Bryan

(10) Patent No.: US 6,544,862 B1
(45) Date of Patent: Apr. 8, 2003

(54) PARTICLE DISTRIBUTION METHOD AND RESULTING STRUCTURE FOR A LAYER TRANSFER PROCESS

(75) Inventor: Michael A. Bryan, Los Gatos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 09/484,383

(22) Filed: Jan. 14, 2000

(51) Int. Cl.[7] .......................... H01L 21/30; H01L 21/46
(52) U.S. Cl. ........................ 438/455; 438/458; 257/617
(58) Field of Search ............................... 438/455, 462, 438/407, 458

(56) References Cited

U.S. PATENT DOCUMENTS

| 3,390,033 A | 6/1968 | Brown ..................... 216/95 |
| 3,770,499 A | 11/1973 | Crowe et al. ............ 438/785 |
| 3,901,423 A | 8/1975 | Hillberry et al. .......... 225/2 |

(List continued on next page.)

FOREIGN PATENT DOCUMENTS

| EP | 961 312 A2 | 12/1999 | |
| FR | 0 807 970 A1 | * 11/1997 | ......... H01L/21/762 |
| GB | 2 231 197 A | 11/1990 | |
| JP | 59-193904 A | 11/1984 | |
| JP | 3-109731 A | 5/1991 | |
| JP | 3-132055 A | 6/1991 | |
| JP | 3-265156 A | 11/1991 | |
| JP | 4-298023 A | 10/1992 | |
| JP | 10-200080 A | 7/1998 | |
| JP | 11-045840 A | 2/1999 | |
| JP | 2000-94317 A | 4/2000 | |

OTHER PUBLICATIONS

Choyke et al., "Mechanical Response of Single Crystal Si to Very High Fluence H+Implantation," *Nuc. Instr. Meth.*, 209–210:407–412 (1983).

Choyke et al., "Implanted Hydrogen Effects at High Concentrations in Model Low Z Shielding Materials," *J. Nuc. Mtrls.*, 122–23:1585–86 (1984).

Choyke et al., "A Comparative Study of Near–Surface Effects Due to Very High Fluence H+Implantation in Single Crystal FZ, CZ, and Web SI," *Mat. Res. Soc. Symp. Proc.*, 27:359–364 (1984).

Carter et al., "The Collection of Ions Implanted in Semiconductors II, Rnage distributions Derived from Collection and Sputter–Etch Curves," *Radiation Effects*, 16:107–114 (1972).

Corbett et al., "Embrittlement of Materials: Si(H) as a Model System," *J. Nuc. Mtrls.*, 169: 179–184 (1989).

Grovenor, C.R.M., *Microelectronic Materials*, pp. 73–75 (1989).

Johnson et al., "Hydrogen–Induced Platelets in Silicon: Separation of Nucleation and Growth," *Mtrls. Sci. Forum*, 83–87:33–38 (1992).

Mahajan et al., *Principles of Growth and Processing of Semiconductors*, WCB McGraw–Hill, chapter 6, pp. 262–269.

Milnes et al., "Peeled Film Technology for solar Cells," pp. 338–341.

Oshima et al., "Defects in Si irradiated with D–T neutrons, D and He ions," *J. Nuc. Mtrls.*, 179–181:947–950 (1991).

Smith, D.L., *Thin–Film Deposition*, McGraw–Hill, Inc., pp. 185–196, 278–293.

(List continued on next page.)

Primary Examiner—William David Coleman
(74) Attorney, Agent, or Firm—Townsend and Townsend and Crew LLP

(57) ABSTRACT

A method of forming substrates. The method includes providing a donor substrate; and forming a particle accumulation region at a selected depth in the donor substrate. The method includes diffusing a plurality of particles into the particle accumulation region to add stress to the particle accumulation region; and separating a thickness of material above the selected depth in the donor substrate.

12 Claims, 2 Drawing Sheets

U.S. PATENT DOCUMENTS

| | | | |
|---|---|---|---|
| 3,946,334 A | 3/1976 | Yonezu | 372/36 |
| 4,053,335 A | 10/1977 | Hu | 376/258 |
| 4,216,906 A | 8/1980 | Olsen et al. | 239/11 |
| 4,237,601 A | 12/1980 | Woolhouse et al. | 438/33 |
| 4,244,348 A | 1/1981 | Wilkes | 125/23.01 |
| 4,255,208 A | 3/1981 | Deutscher et al. | 438/72 |
| 4,375,125 A | 3/1983 | Byatt | 125/23.01 |
| 4,539,050 A | 9/1985 | Kramler et al. | 438/472 |
| 4,645,546 A | 2/1987 | Matsushita | 148/33 |
| 4,706,377 A | 11/1987 | Shuskus | 438/285 |
| 4,766,086 A | 8/1988 | Ohshima et al. | 438/402 |
| 4,891,329 A | 1/1990 | Reisman et al. | 438/459 |
| 4,956,693 A | 9/1990 | Sawahata et al. | 257/611 |
| 4,983,251 A | 1/1991 | Haisma et al. | 438/3 |
| 5,102,821 A | 4/1992 | Moslehi | 438/456 |
| 5,162,241 A | 11/1992 | Mori et al. | 438/402 |
| 5,206,749 A | 4/1993 | Zavracky et al. | 349/45 |
| 5,256,562 A | 10/1993 | Vu et al. | 438/28 |
| 5,258,320 A | 11/1993 | Zavracky et al. | 438/27 |
| 5,258,325 A | 11/1993 | Spitzer | 438/107 |
| 5,277,748 A | 1/1994 | Sakaguchi et al. | 438/406 |
| 5,303,574 A | 4/1994 | Matossian et al. | 73/7 |
| 5,308,776 A | 5/1994 | Gotou | 438/311 |
| 5,317,236 A | 5/1994 | Zavracky et al. | 438/27 |
| 5,344,524 A | 9/1994 | Sharma et al. | 438/459 |
| 5,362,671 A | 11/1994 | Zavracky et al. | 438/29 |
| 5,374,564 A * | 12/1994 | Bruel | 148/DIG. 12 |
| 5,377,031 A | 12/1994 | Vu et al. | 349/45 |
| 5,413,679 A | 5/1995 | Godbey | 438/702 |
| 5,438,241 A | 8/1995 | Zavracky et al. | 315/169.3 |
| 5,443,661 A | 8/1995 | Oguro et al. | 148/33.5 |
| 5,444,557 A | 8/1995 | Spitzer et al. | 349/42 |
| 5,459,016 A | 10/1995 | Debe et al. | 430/201 |
| 5,475,514 A | 12/1995 | Salerno et al. | 438/27 |
| 5,480,842 A | 1/1996 | Clifton et al. | 438/464 |
| 5,528,397 A | 6/1996 | Zavracky et al. | 349/42 |
| 5,539,245 A | 7/1996 | Imura et al. | 257/691 |
| 5,569,620 A | 10/1996 | Linn et al. | 438/406 |
| 5,581,385 A | 12/1996 | Spitzer et al. | 349/58 |
| 5,611,855 A | 3/1997 | Wijaranakula | 117/2 |
| 5,643,834 A | 7/1997 | Harada et al. | 117/2 |
| 5,744,852 A | 4/1998 | Linn et al. | 438/122 |
| 5,753,560 A | 5/1998 | Hong et al. | 438/402 |
| 5,755,914 A | 5/1998 | Yonehara | 156/281 |
| 5,763,319 A | 6/1998 | Ling et al. | 438/514 |
| 5,783,022 A | 7/1998 | Cha et al. | 156/344 |
| 5,804,086 A | 9/1998 | Bruel | 216/33 |
| 5,821,158 A | 10/1998 | Shishiguchi | 438/528 |
| 5,824,595 A | 10/1998 | Igel et al. | 438/48 |
| 5,827,751 A | 10/1998 | Nuyen | 438/28 |
| 5,840,590 A | 11/1998 | Myers, Jr. et al. | 438/471 |
| 5,854,123 A * | 12/1998 | Sato et al. | 438/478 |
| 5,882,987 A * | 3/1999 | Srikrishnan | 148/DIG. 50 |
| 5,909,627 A | 6/1999 | Egloff | 438/406 |
| 5,966,620 A * | 10/1999 | Sakaguchi et al. | 438/455 |
| 5,985,742 A | 11/1999 | Henley et al. | 438/515 |
| 5,993,677 A | 11/1999 | Biasse et al. | 210/709 |
| 5,994,207 A | 11/1999 | Henley et al. | 438/515 |
| 6,010,579 A | 1/2000 | Henley et al. | 148/33.2 |
| 6,013,563 A | 1/2000 | Henley et al. | 438/458 |
| 6,013,567 A | 1/2000 | Henley et al. | 438/515 |
| 6,020,252 A | 2/2000 | Aspar et al. | 438/458 |
| 6,033,974 A | 3/2000 | Henley et al. | 438/526 |
| 6,048,411 A | 4/2000 | Henley et al. | 148/33.5 |
| 6,077,383 A | 6/2000 | Laporte | 156/344 |
| 6,083,324 A | 7/2000 | Henley et al. | 148/33.2 |
| 6,120,597 A | 9/2000 | Levy et al. | 117/3 |
| 6,150,239 A | 11/2000 | Goesele et al. | 438/458 |
| 6,159,824 A | 12/2000 | Henley et al. | 438/455 |
| 6,171,965 B1 | 1/2001 | Kang et al. | 438/695 |
| 6,184,111 B1 | 2/2001 | Henley et al. | 438/514 |
| 6,190,998 B1 * | 2/2001 | Bruel et al. | 438/407 |
| 6,191,007 B1 * | 2/2001 | Matsui et al. | 438/455 |
| 6,214,701 B1 | 4/2001 | Matsushita et al. | 438/458 |
| 6,225,192 B1 | 5/2001 | Aspar et al. | 438/460 |
| 6,323,108 B1 * | 11/2001 | Kub et al. | 438/406 |

OTHER PUBLICATIONS

Sze, S.M., *VLSI Technology*, 2nd Edition, pp. 9–10, (1988).

Tong et al., "A 'smarter-cut'approach to low temperature silicon layer transfer," *Appl. Phys. Lett.*, 72(1):49–51 (1998).

Tong et al., *Semiconductor Wafer Bonding: Science and Technology*, John Wiley & Sons, Inc., pp. 152–171.

* cited by examiner

PARTICLE DISTRIBUTION METHOD AND RESULTING STRUCTURE FOR A LAYER TRANSFER PROCESS

BACKGROUND OF THE INVENTION

The present invention relates to the manufacture of objects. More particularly, the invention provides a technique including a method and device for cleaving a substrate in the fabrication of a multi-layered substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Many ways of fabricating substrates for the manufacture of integrated circuits have been proposed. In the early days, conventional integrated circuits were fabricated on "bulk" silicon wafers. These bulk silicon wafers were generally single crystal and formed using a process called Czochralski, which is known as CZ. The CZ process melts a batch of silicon metal in a crucible. A seed crystal is used as a starting material to pull a silicon ingot from the melt in the crucible. The ingot is then cut and polished to form the bulk silicon wafers.

Although bulk silicon wafers are widely used today, many such wafers have been replaced by other types. These other types of wafers include, among others, epitaxial silicon wafers, silicon-on-insulator wafers, and the like. High purity applications often require the use of epitaxial silicon wafers. These applications often produce lower yields on CZ wafers so such epitaxial silicon wafers are desirable. High purity applications include the manufacture of high density memory devices, high voltage devices, and microprocessor devices.

Some applications also use silicon on insulator wafers. These wafers generally include a silicon material layer, where devices are to be formed, overlying an insulating layer, commonly made of silicon dioxide, which overlies a bulk substrate material. Silicon on insulator wafers, which are known as SOI wafers, are made using one of many techniques. A common technique for making such wafer is "separation by ion implantation of oxygen," also termed as SIMOX. These SIMOX wafers are often made by implanting high doses of oxygen impurities into a silicon substrate, where the oxygen is later annealed to create an insulating layer underlying a surface of the silicon substrate. An active device layer is defined overlying such insulating layer. SIMOX wafers, however, have numerous limitations. For example, SIMOX wafers are often difficult to make in an efficient manner, since the high doses often require a long implantation time. Implantation is generally an expensive operation in the manufacture of wafers. Additionally, implantation of oxygen often causes damage to the device layer. Such damage can influence the operation and reliability of integrated circuit devices that are fabricated onto the device layer.

Accordingly, other ways of developing SOI wafers have been proposed. One such way is a "blistering" method for film separation known as Smart Cut™. Such blistering technique is described in detail in U.S. Pat. No. 5,374,564, in the name of Bruel ("Bruel '564"). This thermal blistering technique for manufacturing SOI wafers has many limitations. For high volume production, the high doses of hydrogen often requires the use of many ion implanters, which are expensive and difficult to maintain. Additionally, thermal blistering often creates rough surface finishes, which can produce worthless scrap product. European Application No. EP 0807970A1 ("Aspar '970"), which is also in the name of Aspar, suggests an improved method to the Bruel '564 patent of forming SOI wafers. Aspar '970 suggests a method of mechanically separating a layer having microcavities or microbubbles. Although the Aspar '970 suggests that the doses are generally lower than a minimum causing surface blistering, the doses of hydrogen should still be sufficiently high to allow microcavity and microbubble coalescence through a subsequent heat treatment process. Such thermal treatment process would often require a high temperature, which would lead to an exceedingly rough and imprecise fracture morphology along the microcavity plane. Accordingly, the Aspar '970 also requires high temperatures, which are generally undesirable and lead to excessive surface roughness characteristics.

Still another variation is described in U.S. Pat. No. 5,882,987, which is assigned to International Business Machines Corporation, and in the name of Srikrishnan, Kris V ("Srikrishnan"). Srikrishnan suggests an improvement to the blistering technique taught by the Bruel '564 patent. Here, Srikrishnan suggests an etch-stop layer within a device layer to be released. Additionally, Srikrishnan suggests implanting a large dose of hydrogen to allow separation using the aforementioned "blistering" process to separate the film at a location away from the etch-stop layer, thereby resulting in a structure characterized by the device layer covered by the etch-stop layer and a top surface layer and then selectively removing both layers. This process, which may be advantageous by reducing or eliminating the need for a chemical-mechanical polishing (CMP) step, still generally requires the use of the blistering process, high doses of hydrogen or rare gas ion implantation, and complicated chemical removals.

Yet another method for forming SOI wafers has been described in U.S. Pat. No. 5,854,123, which is assigned to Canon Kabushiki Kaisha, and in the names of Sato, et al ("Sato"). The Sato patent suggests releasing an epitaxial layer, which has been formed on a porous silicon layer. The porous silicon layer is generally made to release the epitaxial layer by providing a high degree of etch selectivity between the epitaxial silicon layer and the porous silicon layer. Unfortunately, this technique is often complicated and expensive. Moreover, epitaxial growth on a porous layer can compromise the quality of the epitaxial film by the introduction of defects into it, which is very undesirable. Other limitations can also exist with such technique.

Accordingly, a pioneering technique made by a company called Silicon Genesis Corporation has been developed. Such technique relies upon a controlled cleaving process, which is known as CCP, to manufacture SOI wafers and other structures. The CCP technique produces improved films using a room temperature process to cleave films. The room temperature process is generally free from microbubbles or microcavities, which may lead to blisters and the like caused by the conventional process described in Bruel. Although overcoming many limitations in conventional techniques, CCP can still be improved.

From the above, it is seen that an improved method for manufacturing substrates is highly desirable.

SUMMARY OF THE INVENTION

According to the present invention, a technique including a method and device for manufacturing objects is provided.

In an exemplary embodiment, the present invention provides a method for fabricating multilayered substrates from a cleaving process.

In a specific embodiment, the present invention provides a method of forming substrates, e.g., silicon, silicon germanium. The method includes providing a donor substrate; and forming a particle accumulation region at a selected depth in the donor substrate. In a preferred embodiment, the particle accumulation region is made by introducing defects by way of implantation techniques (e.g., silicon ions) into a plane along such region. The method includes diffusing a plurality of particles from a higher concentration region into the particle accumulation region to add stress to the particle accumulation region; and separating a thickness of material above the selected depth in the donor substrate. Separating frees the thickness of material above the selected depth.

In a further embodiment, the present invention provides a method of fabricating a film of material for a Smart Cut™ process. Here, the Smart Cut process is described in U.S. Pat. No. 5,374,564, which is incorporated by reference here. The method includes providing a donor substrate; and introducing a plurality of first particles through a surface of the donor substrate to a first depth to define a particle accumulation region and a material region about the particle accumulation region. The method also includes introducing a plurality of second particles to a second depth of the donor substrate; and diffusing the second particles from the second depth to the particle accumulation region to add stress to the particle accumulation region. The diffusion is continued to cause a crystalline rearrangement effect and a pressure to cause a separation of the material region from the donor substrate at the particle accumulation region.

Numerous benefits are achieved over pre-existing techniques using the present invention. The present invention produces less implant damage than conventional techniques. Additionally, the invention can require lower overall implant dosages. Further, the invention takes advantage of lower cost equipment such as a diffusion furnace, rather than an expensive implanter. Depending upon the application, one or more of these advantages may exist.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

According to the present invention, a technique including a method and device for manufacturing objects is provided. In an exemplary embodiment, the present invention provides a method for separating a film from a donor substrate using a cleaving process, which generally relies upon adding stress to a particle accumulation region to free such film from the donor substrate.

Figure 1:
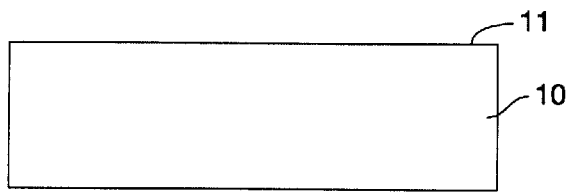
FIGS. 1–6 are simplified diagrams of methods according to embodiments of the present invention

FIGS. 1–6 are simplified diagrams of methods according to embodiments of the present invention. These diagrams are merely examples which do not unduly limit the scope of the claims herein. One of ordinary skill in the art would recognize many other variations, modifications, and alternatives. Referring to FIG. 1, the present method begins by providing a substrate 10. The substrate can be any suitable substrate such as a silicon wafer (e.g., bulk, multilayered) and others. The substrate 10 has a top surface 11, which is substantially planar in this application. Other forms can also exist, including non-planar, spherical, etc.

Figure 2:
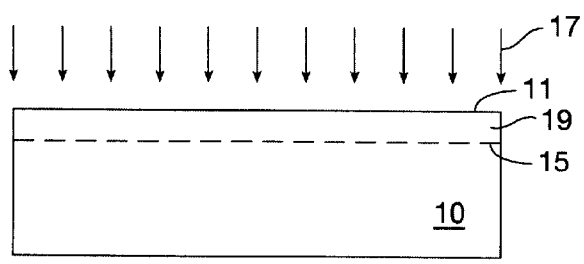

Next, the process includes forming a particle accumulation region 15 at a selected depth into the substrate, as shown in FIG. 2. The particle accumulation region is a plane or spatial region, where particles can accumulate according to the present invention. The particle accumulation region is a damaged region, which attracts particles. The particle accumulation region can also be an interface between two other layers. In a specific embodiment, the particle accumulation region 15 is formed by implantation 17 of ions into the substrate to the selected depth. Above the accumulation region is a device layer 19, which will be removed. The ions can be selected from heavier mass particles (e.g., silicon), lighter mass particles (e.g., hydrogen, deuterium, lithium, boron, oxygen) or any combination of these. In a preferred embodiment, the present invention provides an implantation process using silicon bearing particles, e.g., silane, dichlorosilane, trichlorosilane. Here, the silicon bearing particles can be derived from an ion implanter, plasma immersion implanter, plasma shower, ion shower, and other devices. The particles are implanted at a dose ranging from about $10^{14}$ to about $10^{17}$ atoms/cm$^2$. The particles have an energy of about 0.5 keV to about 0.5 MeV, but can be others.

Figure 3:
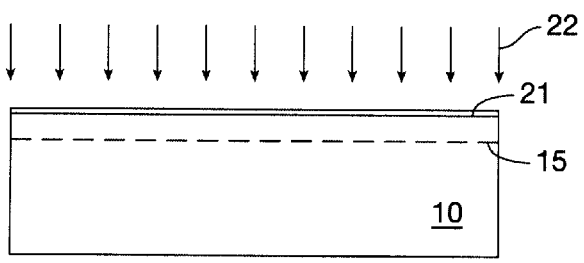

In a specific embodiment, the method introduces additional particles 22 into a selected depth 21 of the substrate, as shown in FIG. 3. The selected depth is often shallower than the depth of the particle accumulation region (or deeper in some embodiments). The selected depth can also be a surface region of the substrate. Depending upon the application, smaller mass particles are generally selected to reduce a possibility of damage to the device layer 17. That is, smaller mass particles easily travel through the device layer to the cleaving layer without substantially damaging the device layer that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes (i.e., deuterium), rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to a selected depth underneath the surface of the device layer.

Using hydrogen as the implanted species into the silicon wafer as an example, the implantation process is performed using a specific set of conditions. Implantation dose ranges from about $10^{14}$ to about $10^{17}$ atoms/cm$^2$, and preferably the dose is greater than about $10^{15}$ atoms/cm$^2$. Implantation energy ranges from about 0.5 keV to about 0.5 MeV, and is generally about 20–40 keV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

Figure 4:
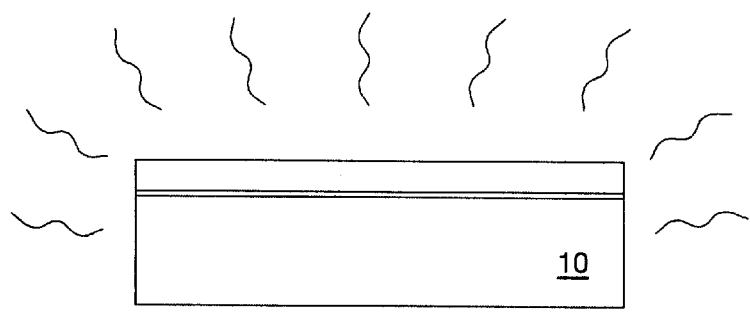
Figure 5:
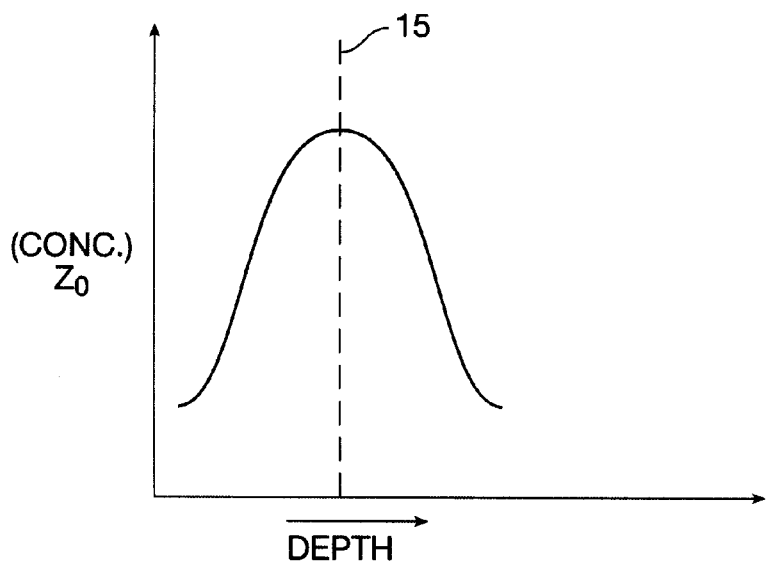

Next, the implanted particles are redistributed from the selected depth to the accumulation region, as shown in FIG. 4. In a specific embodiment, the particles are diffused by a thermal process from the selected depth to the accumulation region. The thermal process can be applied by an annealing furnace, such as a Tystar, Kokusai, or AG. The particles generally migrate from the selected depth or from a region along the selected depth and redistribute to the particle accumulation region. Preferably, the diffusion process occurs at a temperature from about 300 to about 700 Degrees Celsius, which also repairs any possibility of damage caused from the implantation process. A plasma assisted diffusion process can also be used to enhance diffusion.

Effectively, the implanted particles add stress or reduce required fracture energy along a region parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of the substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can be repaired by subsequent heat treatment, e.g., thermal annealing or rapid thermal annealing.

Once particles have been introduced into the cleaving layer, the donor substrate can be bonded to a handle substrate. Here, optionally, a step of low temperature plasma activation can be used to clean faces of the substrates. Then, the substrates are bonded together. A thermal treatment step can follow the bonding step to improve bond integrity. In a specific embodiment, the thermal treatment step temperature/time combination can also cause the particles to redistribute to the particle accumulation region.

Figure 6:
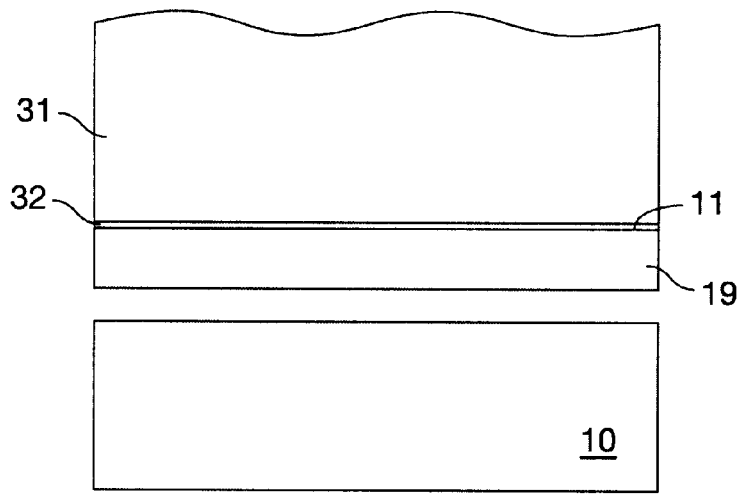

In a specific embodiment, a controlled cleaving process is performed, as shown in FIG. 6. Here, the donor substrate has been bonded to a handle substrate 31. Bonding can occur using a variety of techniques to attach substrate 10 to substrate 31. In a specific embodiment, a silicon dioxide layer 32 can be used to attach these substrates together to form a multilayered substrate structure. In a specific embodiment, the bonded substrates undergo a step of selective energy placement or positioning or targeting which provides a controlled cleaving action at the stressed region along the cleave plane. In preferred embodiments, selected energy placement occurs near an edge or corner region of the stressed region of substrate. The impulse or impulses are provided using energy sources.

Examples of sources include, among others, a chemical source, a mechanical source, an electrical source, and a thermal sink or source. The chemical source can include a variety such as particles, fluids, gases, or liquids. These sources can also include chemical reaction to increase stress in the stressed region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electro-magnetic field, which is introduced as flood, time-varying, spatially varying, or continuous. In still further embodiments, the thermal source or sink is selected from radiation, convection, or conduction. This thermal source can be selected from, among others, a photon beam, a fluid source, a liquid source, a gas source, an electro/magnetic field, an electron beam, a thermoelectric heating, a furnace, and the like. The thermal sink can be selected from a fluid source, a liquid source, a gas source, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. In a specific embodiment, the energy source can be a fluid source that is pressurized (e.g., compressional) according to an embodiment of the present invention. A detailed discussion of such a pressurized fluid source is described in U.S. Ser. No. 09/370,975 filed Aug. 10, 1999 which is incorporated by reference herein.

Although the above has been generally described in terms of a specific substrate, many others can also exist. These substrates can include, among others, gallium arsenide, quartz, and silicon carbide. Of course, the type of substrate used depends upon the application.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of fabricating a multi-layered substrate, the method comprising:

providing a donor substrate;

introducing a plurality of first particles through a surface of the donor substrate to a first depth to define a particle accumulation region;

introducing a plurality of second particles to a second depth of the donor substrate;

diffusing the second particles from the second depth to the particle accumulation region to add stress to the particle accumulation region;

joining the donor substrate to a handle substrate; and separating the donor substrate from the handle substrate at the particle accumulation region.

2. The method of claim 1 wherein the donor substrate comprises a silicon wafer.

3. A method of fabricating a film of material, the method comprising:

providing a donor substrate;

introducing a plurality of first particles through a surface of the donor substrate to a first depth to define a particle accumulation region and a material region about the particle accumulation region;

introducing a plurality of second particles to a second depth of the donor substrate;

diffusing the second particles from the second depth to the particle accumulation region to add stress to the particle accumulation region; and continuing to diffuse the second particles to the particle accumulation region to cause a crystalline rearrangement effect and a pressure to cause a separation of the material region from the donor substrate at the particle accumulation region.

4. The method of claim 3 further comprising joining the donor substrate to a handle substrate before the separation of the material region.

5. A The method of claim 3 wherein the second particles are selected from hydrogen or helium.

6. The method of claim 1, wherein the donor substrate is a silicon substrate having (100) crystal orientation.

7. The method of claim 1, wherein the plurality of first particles are hydrogen ions.

8. The method of claim 1, wherein the plurality of second particles are hydrogen ions.

9. The method of claim 1, wherein the separating is provided using a controlled cleaving process.

10. The method of claim 3, wherein the donor substrate is a silicon substrate having (100) crystal orientation.

11. The method of claim 3, wherein the plurality of first particles are hydrogen.

12. The method of claim 3, wherein the plurality of second particles are hydrogen.

* * * * *